(12) United States Patent
Zojceski et al.

(10) Patent No.: US 11,032,889 B2
(45) Date of Patent: Jun. 8, 2021

(54) ELECTROLUMINESCENT LIGHT SOURCE INTENDED TO BE SUPPLIED WITH POWER BY A VOLTAGE SOURCE

(71) Applicant: VALEO VISION, Bobigny (FR)

(72) Inventors: Zdravko Zojceski, Bobigny (FR); Samuel Daroussin, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/285,500

(22) Filed: Feb. 26, 2019

(65) Prior Publication Data

US 2019/0268986 A1    Aug. 29, 2019

(30) Foreign Application Priority Data

Feb. 26, 2018    (FR) ..................................... 18 51636

(51) Int. Cl.
| | |
|---|---|
| *H05B 45/46* | (2020.01) |
| *H01L 27/15* | (2006.01) |
| *H05B 45/10* | (2020.01) |
| *H01L 25/075* | (2006.01) |
| *H01L 33/02* | (2010.01) |
| *H01L 25/16* | (2006.01) |

(52) U.S. Cl.
CPC ........... *H05B 45/46* (2020.01); *H01L 27/156* (2013.01); *H05B 45/10* (2020.01); *H01L 25/0753* (2013.01); *H01L 25/167* (2013.01); *H01L 27/15* (2013.01); *H01L 27/153* (2013.01); *H01L 33/025* (2013.01)

(58) Field of Classification Search
CPC ............ H05B 33/0827; H05B 33/0845; H05B 33/0896; H01L 27/32; H01L 27/3293; H01L 51/5228; H01L 51/5212; H01L 2251/5361

See application file for complete search history.

(56) References Cited

U.S. PATENT DOCUMENTS

| | | | |
|---|---|---|---|
| 9,299,884 B2 * | 3/2016 | Won ........................ | H01L 33/06 |
| 2003/0025120 A1 * | 2/2003 | Chang ..................... | H05B 45/46 |
| | | | 257/92 |
| 2004/0046499 A1 * | 3/2004 | Park ....................... | H05B 33/22 |
| | | | 313/509 |

(Continued)

FOREIGN PATENT DOCUMENTS

| | | |
|---|---|---|
| EP | 2 089 915 | 8/2009 |
| WO | WO 2009/019836 A2 | 2/2009 |
| WO | WO 2011/099658 A1 | 8/2011 |

OTHER PUBLICATIONS

French Preliminary Search Report dated Nov. 14, 2018 in French Application 18 51636, filed on Feb. 26, 2018 (with English Translation of Categories of Cited Documents).

(Continued)

*Primary Examiner* — Renan Luque

(74) *Attorney, Agent, or Firm* — Oblon, McClelland, Maier & Neustadt, L.L.P.

(57) ABSTRACT

A light source intended to be supplied with power by a voltage source. The light source includes a parallel assembly of at least two branches, each branch including at least one elementary light source having an electroluminescent semiconductor element, and each of the elementary light sources has a high internal series resistance.

18 Claims, 2 Drawing Sheets

(56) References Cited

U.S. PATENT DOCUMENTS

| | | | |
|---|---|---|---|
| 2006/0091786 A1* | 5/2006 | Chakraborty | F21K 9/00 313/500 |
| 2009/0134413 A1* | 5/2009 | Roth | C09K 11/7792 257/98 |
| 2009/0230411 A1 | 9/2009 | Chakraborty et al. | |
| 2010/0065861 A1 | 3/2010 | Nagai | |
| 2010/0258835 A1* | 10/2010 | Hsu | H01L 33/382 257/99 |
| 2011/0156572 A1 | 6/2011 | Chakraborty et al. | |
| 2011/0241033 A1 | 10/2011 | Nagai | |
| 2011/0254040 A1 | 10/2011 | Nagai | |
| 2012/0061713 A1* | 3/2012 | Tachibana | H01L 33/42 257/99 |
| 2012/0292633 A1* | 11/2012 | Hung | H01L 27/153 257/76 |
| 2012/0313076 A1* | 12/2012 | Nakamura | H01L 33/0062 257/13 |
| 2013/0015760 A1 | 1/2013 | Chakraborty et al. | |
| 2013/0020938 A1* | 1/2013 | Seif | B60Q 1/2607 315/82 |
| 2014/0252966 A1* | 9/2014 | Balazs | H05B 45/46 315/186 |
| 2014/0299900 A1 | 10/2014 | Chakraborty et al. | |
| 2015/0076533 A1 | 3/2015 | Chakraborty et al. | |
| 2015/0228865 A1 | 8/2015 | Rhee | |
| 2015/0294960 A1 | 10/2015 | Chakraborty et al. | |
| 2016/0178177 A1* | 6/2016 | Ebner | F21K 9/60 362/237 |
| 2017/0325305 A1* | 11/2017 | Takizawa | H05B 45/46 |
| 2018/0212103 A1* | 7/2018 | Zhang | H01L 27/15 |

OTHER PUBLICATIONS

Jung, K., et al., "Design and Implementation of a Current-balancing Circuit for LED Security Lights", Journal of Power Electronics, vol. 12, No. 6, Nov. 2012, 9 pages.

* cited by examiner

ELECTROLUMINESCENT LIGHT SOURCE INTENDED TO BE SUPPLIED WITH POWER BY A VOLTAGE SOURCE

The invention pertains to light sources having an electroluminescent semiconductor element, in particular for motor vehicles. The invention relates in particular to such a source involving a plurality of elementary light sources having an electroluminescent semiconductor element.

A light-emitting diode, LED, is an electronic component capable of emitting light when it is flowed through by an electric current. The luminous intensity emitted by an LED is generally dependent on the intensity of the electric current flowing through it. In other words, an LED is characterized by a current intensity threshold value. The threshold value of the intensity of this forward current generally decreases as the temperature increases. Likewise, when an LED emits light, a voltage drop equal to its forward voltage is observed across its terminals. The value of the forward voltage depends mainly on the wavelength of the emitted light, which defines the energy of the emitted photon in eV. Generally speaking, it is possible to estimate $\lambda=1240/E$, with lambda in nanometres and E in electron volts. Therefore, the forward voltage of an LED emitting a blue light at 460 nm is at least 2.7 V, or 1.9 V for a red light at 650 nm. In other words, if the source voltage is close to the voltage $E=1240/\lambda$, this means that no regulation source is adding an additional voltage drop, and that the efficiency of the assembly is identical to a single LED, without any other driving system.

Each LED is additionally characterized by an internal series resistance, due to the presence of a plurality of non-light-emitting semiconductor layers, which serve only to transport electrons or to transport electron holes, or due to the presence of via connections allowing vertical connections between various layers. These factors contribute to the resistance of the LED component. As is known, care is taken to produce LED components having a low internal series resistance, of the order of a fraction of an ohm, so as to approach the behaviour of components of an ideal diode, whose voltage depends mainly on the voltage of the gap of the semiconductor. In the automotive field, LED technology is increasingly being used for numerous luminous signalling solutions. LEDs are used to provide luminous functions such as daytime running lights, signalling lights, etc. LED components resulting from one of the same production method may nevertheless exhibit different characteristics (emission capability, forward voltage, series resistance, etc.). In order to group together components having similar characteristics, the LEDs that are produced are sorted into groups, also called a bin, each bin grouping together LEDs having similar characteristics. Within each group or bin, variations of up to 20% with respect to the average characteristics of the bin are generally accepted.

In order for an LED to be able to emit light, it is necessary to apply an electric voltage at least equal to its forward voltage between the anode and the cathode of the component. For a series assembly of a plurality of LEDs, the voltage applied between the anode of the first LED of the assembly and the cathode of the last LED of the assembly has to be at least equal to the sum of the voltage drops across the terminals of each of the LEDs. For a parallel assembly of a plurality of LEDs, the voltage applied across the terminals of each branch has to be at least equal to the sum of the voltage drops across the terminals of each of the LEDs of the branch containing the largest number of LEDs out of all of the branches of the assembly. As the characteristics of LEDs in such a parallel assembly may differ—even if the LEDs form part of the same bin—the intensity of the electric current flowing through the LEDs varies in a known manner from one branch to the other of such a parallel assembly. The distribution of the electric current among the branches of the assembly is not uniform. This means not only that the luminous intensity emitted by the LEDs of the various branches varies, but also that this situation may reduce the lifetime of the LED components. When one of the branches is flowed through by a high electric current, the temperature of the semiconductor components of this branch increases, this again leading to an increase in the electric current flowing through their semiconductor junctions, until these fail. To mitigate these problems, it is known to provide a current source for each branch or even for each LED of a parallel assembly of a plurality of LEDs. The current source ensures a predetermined intensity of the electric current flowing through the LEDs. However, the efficiency of the current source, expressed as the ratio between the optical power emitted by the light source and the electric power supplied to the light source in order to emit said optical power, is lower.

This situation becomes all the more pronounced as the number of LEDs of the assembly and of branches connected in parallel increases. However, in many applications, it is beneficial to use matrices of electroluminescent light sources. Such an matrix comprises an assembly of a plurality of parallel branches, and each branch comprises a high number of electroluminescent light sources connected in series. The number of current sources that are necessary is therefore high, and therefore the efficiency of the matrix is reduced.

However, the use of matrices of LEDs comprising a high number of elementary electroluminescent light sources is beneficial in numerous fields of application, and in particular in the field of lighting and signalling for motor vehicles. A matrix of LEDs may be used for example to create light beam forms that are beneficial for lighting functions, such as headlights or daytime running lights. In addition, a plurality of different lighting functions may be produced using a single matrix, thus reducing the physical bulk in the restricted space of a motor vehicle headlight.

An aim of the invention is to overcome at least one of the problems posed by the prior art. More precisely, the aim of the invention is to propose a light source having improved energy efficiency.

According to a first aspect of the invention, a light source is proposed. The light source is intended to be supplied with power by a voltage source, and comprises a parallel assembly of at least two branches. Each branch comprises at least one elementary light source having an electroluminescent semiconductor element. Each of the elementary light sources is characterized by an identical internal series resistance of at least 1 ohm, the series resistance being determined by the structure of the semiconductor layers contained in the elementary light sources.

Each branch of the assembly may preferably comprise a series assembly of a plurality of elementary light sources.

At least some of the branches of the assembly may comprise a switch device connected in series with the elementary light sources on the low side of the branch.

The switch device may preferably comprise an N-channel metal-oxide-semiconductor field-effect transistor (MOSFET).

The internal series resistance of the elementary light sources may preferably be determined by the thickness of the semiconductor layers, their extent, via connections between the layers, or by a combination of these factors.

The internal series resistances of each of the elementary light sources may preferably be identical and between 1 and 100 ohm.

In order to reduce the gap between the series resistances, the elementary light sources preferably form part of a monolithic component in which the semiconductor layers of the elementary light sources are arranged on a common substrate.

The semiconductor layers of the elementary light sources may preferably be deposited together and at the same time. The deposition may preferably be performed in a common chamber, for example using a metal oxide chemical vapour deposition (MOCVD) method.

Each of the elementary light sources may preferably comprise an n-doped semiconductor layer with a thickness of between 0.1 and 2 μm. This may preferably be an n-doped GaN semiconductor layer.

The elementary light sources may preferably be arranged on a common substrate so as to form a matrix of elementary light sources.

In such a configuration, reducing the size of each elementary source makes it possible to precisely increase the series resistance of each source so as to make it compatible with the driving circuit.

In order to keep the efficiency of the assembly as high as possible, preferably none of the branches of the assembly comprises an electric current regulation device external to the elementary light sources, other than a possible switch device.

According to another aspect of the invention, a lighting module for a motor vehicle is proposed. The lighting module comprises a voltage source operationally connected to a light source. The module is noteworthy in that the light source is in accordance with one aspect of the invention, and in that the electric voltage level supplied by the voltage source to the light source is suitable for supplying power thereto.

The module may preferably comprise a control unit operationally connected to the switches of each branch of the assembly of the light source, the control unit being intended to command the opening state of the switches. The control unit may preferably comprise a microcontroller element.

The voltage source may preferably comprise a multiphase DC-to-DC circuit, and may preferably be configured so as to supply an electric current having an intensity of between 1 and 100 A.

The voltage source may preferably be configured so as to reduce the voltage from 1 to 3 mV/° C. in order to compensate the decrease in the forward voltage of the elementary light sources as a function of the temperature.

The voltage emitted by the voltage source may preferably be regulated and/or limited as a function of the total current flowing in the assembly of the light source.

The voltage of the voltage source may preferably be regulated and/or limited as a function of the total current with compensation as a function of the number of pixels/elementary light sources supplied with power.

The voltage source is preferably configured so as to supply a voltage close to the voltage $E=1240/\lambda$ with lambda in nanometres and E in volts.

According to yet another aspect of the invention, a method for manufacturing elementary light sources of a light source according to a previous aspect of the invention is proposed. The method is noteworthy in that the p-doped and n-doped semiconductor epitaxial layers of all of the elementary light sources are produced uniformly on a common substrate, such that an electric current with a uniform intensity flows to the elementary light sources when a common electric voltage is applied to the light source. The semiconductor layers of all of the elementary light sources may preferably be produced together at the same time in at least one step of the method.

Via connections between at least two semiconductor layers of the elementary light sources may preferably be produced in at least one step of the method.

The p-doped and n-doped semiconductor layers may preferably be deposited using a metal oxide chemical vapour deposition (MOCVD) method.

The thickness of these layers may preferably be optimized so as to achieve the series resistance compatible with a voltage source.

By using the measures proposed by the embodiments of the present invention, it becomes possible to drive a light source having electroluminescent semiconductor elements by using only a voltage source, even though the light source has a plurality of elementary electroluminescent light sources connected in parallel. In contrast to light sources known from the prior art, the elementary light sources that are proposed have a high internal series resistance, of the order of 1 to 100 ohm. The characteristics of the elementary light sources involved in the assembly of a light source according to the claims are homogeneous. The homogeneous resistance among the elementary light sources and their high internal series resistance provides uniform distribution of the current among the branches of the parallel assembly of the elementary sources, while at the same time ensuring homogeneous brightness among the various branches. As it is therefore possible to dispense with current sources dedicated to regulating the intensity of the electric current in each branch or for each LED of the assembly, the ratio between the optical power emitted by a light source such as proposed and the electric power supplied to the source in order to bring about this emission is higher in comparison with a source comprising a similar parallel assembly, generating a similar optical power and requiring an identical forward voltage. The energy efficiency of the source is therefore improved in comparison with known light sources. In the closed system of a motor vehicle, the energy efficiency of the electrical components, and therefore also of the LED matrix, is an important measurement. The measures that are proposed make it possible to create monolithic matrix LED components formed on a single substrate common to all of the elementary light sources of the components, the component having an advantageous energy efficiency since it is supplied with power only by a voltage source.

Other features and advantages of the present invention will be better understood with the aid of the description of the examples and of the drawings, in which.

Figure 1:
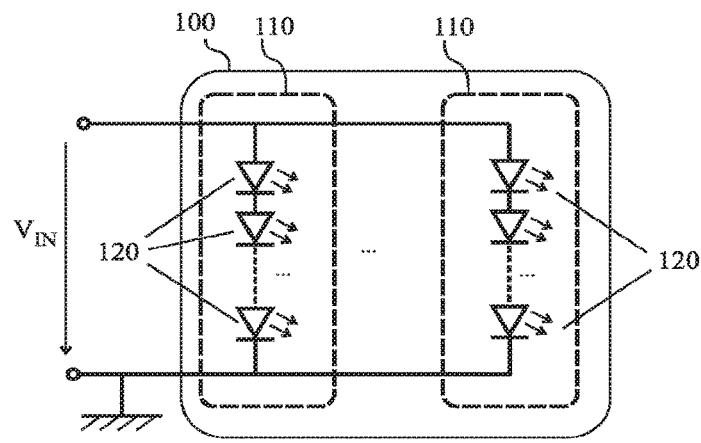
FIG. 1 shows a schematic view of a light source according to one preferred embodiment of the invention.

Unless specified otherwise, technical features that are described in detail for one given embodiment may be combined with the technical features that are described in the context of other embodiments described by way of example and without limitation. Similar reference numerals will be used to describe similar concepts across various embodiments of the invention. For example, the references 100, 200, 300 and 400 denote four embodiments of a light source according to the invention.

The illustration of FIG. 1 shows a circuit diagram of a light source 100 according to a first embodiment of the invention. The light source 100 comprises a parallel assembly of a plurality of branches 110. Each branch of the assembly 100 comprises at least one and preferably a plurality of light emitting diodes, LED, 120 connected in series. In the example illustrated, the light source 100 comprises a matrix of LEDs. Each of the LEDs 120 is characterized by an internal series resistance that is identical to the internal series resistance of all of the other LEDs 120 of the light source 100. The resistance is at least equal to 1 ohm; according to one preferred embodiment, it lies between 5 and 30 or 100 ohm. The high internal series resistance, which is uniform among all of the LEDs 120 of the light source 110, allows the electric current that flows through the assembly to be distributed uniformly over all of the branches 110 of the assembly. In order to supply power to the source and ensure that it has homogeneous brightness among the branches, it is enough to apply a voltage Vin equal at least to the sum of the forward voltages of all of the LEDs of the branch comprising the highest number of LEDs out of all of the branches, that is to say applied to the light source 100. Other measures for regulating the intensity of the electric current that flows through the LEDs 120 with respect to the LEDs 120 are not necessary. This increases the energy efficiency in comparison with light sources having equivalent electroluminescent semiconductor elements, which require current sources in order to regulate the intensity of the electric current flowing through their elementary light sources.

Figure 2:
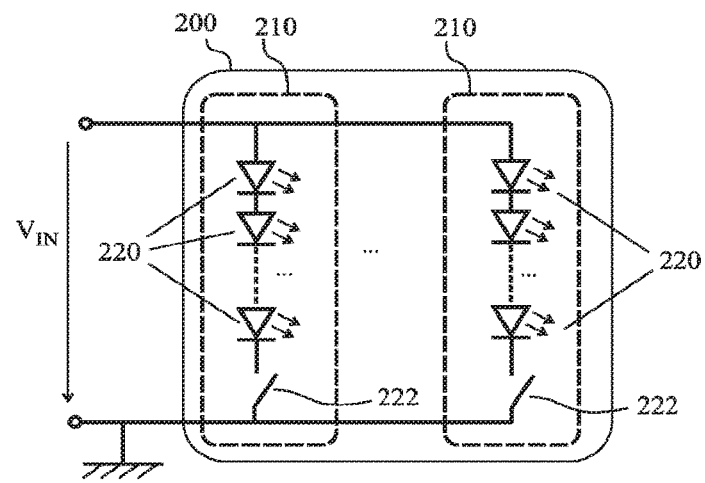
FIG. 2 shows a schematic view of a light source according to one preferred embodiment of the invention.

According to the embodiment of FIG. 2, at least some of the branches 210, and preferably each branch of the parallel assembly of the light source 200, comprises a switch device 222 connected in series with the elementary light source or sources 220. Selectively closing and opening the switch device makes it possible to selectively supply power to the branch 210 in question of the assembly of the light source. In contrast to known matrix LED sources, the characteristics of the light source 200, which are similar to that shown in FIG. 1, make it possible to produce the switch device 222 on the low side of each branch 210. The low-side switch may preferably be produced using an n-channel metal-oxide-semiconductor field-effect transistor (MOSFET). An n-channel MOSFET generally has a much smaller surface area than a p-channel MOSFET transistor, which would be necessary if the switch device were to have to feature on the high side of each branch of the assembly.

Figure 3:
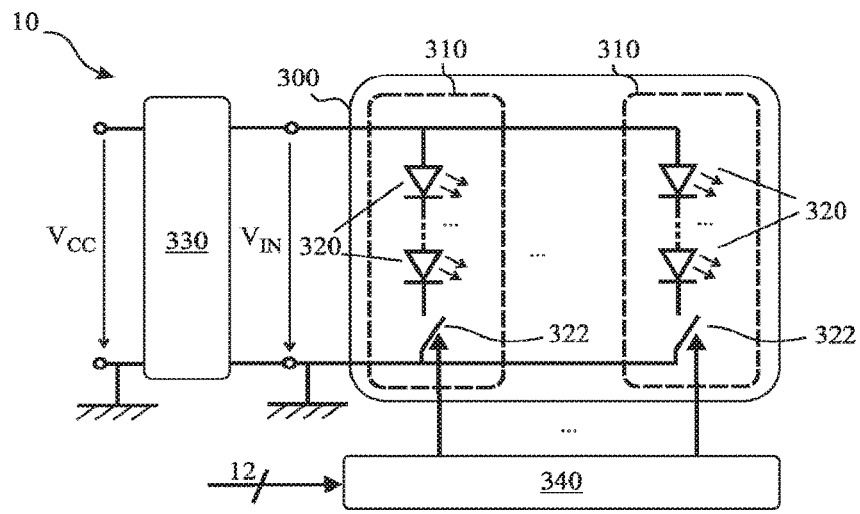
FIG. 3 shows a schematic view of a lighting module for a motor vehicle according to one preferred embodiment of the invention.

FIG. 3 shows a lighting module 10 for a motor vehicle comprising a light source 300 similar to the light source 200 and illustrated by FIG. 2. The light source 300 comprises a plurality of branches 310 connected in parallel. Each branch 310 comprises a plurality of LEDs 320 connected in series, followed by a low-side switch 322. The module 10 furthermore comprises a voltage source 330 intended to supply a voltage Vin to the light source 300. The voltage source 330 is produced for example by way of a converter circuit that converts an input voltage Vcc supplied by a battery internal to the motor vehicle into a voltage Vin suitable for supplying power to the light source 300. Such converter circuits are known in the art, and their operation will not be described in detail in the context of the present invention. The module also comprises a control unit 340 designed to command the open/closed state of the switch devices 322. The control unit is formed for example by a microcontroller element programmed for this purpose, which receives instructions 12 from a central unit of the motor vehicle and translates them, in accordance with preprogrammed rules, into control signals intended for the switches 322. As an alternative, the control unit is formed for example by way of an electronic circuit dedicated to this function.

Figure 4:
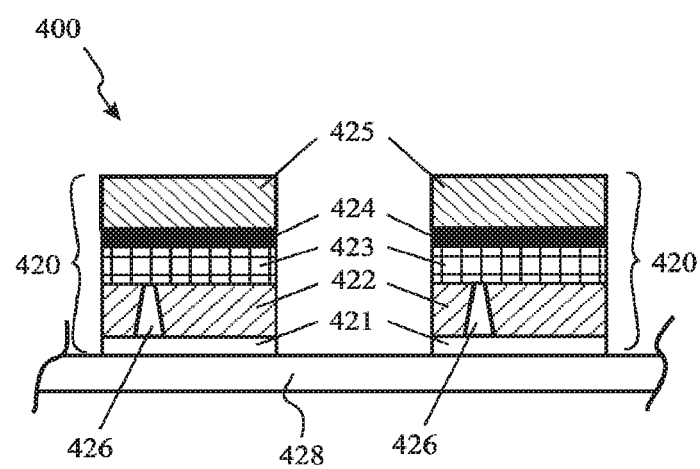
FIG. 4 shows a schematic view of a cross section through a light source according to one preferred embodiment of the invention.

FIG. 4 shows a cross section through a light source 400 according to another embodiment of the invention. The light source 400 is a monolithic component in which the semiconductor layers of the elementary light sources 420 are arranged on a common substrate 428. The light source 400 comprises a parallel assembly of a plurality of branches, each branch comprising electroluminescent semiconductor light sources 420. The cross-sectional view of FIG. 4 makes it possible to see the various layers 421-425 of the elementary light sources 420, arranged above one another along the axis marked "x" perpendicular to the substrate 428.

By way of example and without limitation, the light source 400 comprises a first electrically conductive layer 421 deposited on the electrically insulating substrate 428. This is followed by an n-doped semiconductor layer 422 whose thickness lies between 0.1 and 2 μm. This thickness is much smaller than that of known light-emitting diodes, for which the corresponding layer has a thickness of the order of 1 to 2 μm. The layer 423 is the active quantum well layer having a thickness of around 30 nm, followed by an electron-blocking layer 424, and finally a p-doped semiconductor layer 425, the latter having a thickness of around 300 nm. Phosphor layers, which are known in the art, not shown in this example. Preferably, the layer 421 is an (Al)GaN:Si layer, the layer 422 is an n-GaN:Si layer, the active layer comprises quantum wells made of InGaN alternating with barriers made of GaN. The blocking layer 424 is preferably made of AlGaN:Mg and the p-doped layer 425 is preferably made of p-GaN:Mg. n-doped gallium nitride has a resistivity of 0.0005 Ohm/cm, whereas p-doped gallium nitride has a resistivity of 1 ohm/cm. The thicknesses of the proposed layers make it possible in particular to increase the internal series resistance of the elementary source, while at the same time significantly reducing its manufacturing time, as the u-doped layer is not as thick in comparison with known LEDs and requires a shorter deposition time. By way of example, a time of 5 hours is typically required for MOCVD depositions for a standard-configuration LED with 2 μm of n layer, and this time may be reduced by 50% if the thickness of the n layer is reduced to 0.2 μm.

In order to achieve elementary light sources 420 having semiconductor layers 422, 424 that have homogeneous thicknesses, the monolithic component 400 is preferably manufactured by depositing the layers 421-425 homogeneously and uniformly over at least part of the surface of the substrate 428 so as to cover it. The layers are deposited for example using a metal oxide chemical vapour deposition (MOCVD) method. Such methods and reactors for implementing them are known for depositing semiconductor layers on a substrate, for example from patent documents WO 2010/072380 A1 or WO 01/46498 A1. Details on their implementation will therefore not be described in the context of the present invention. The layers thus formed are then pixelated. By way of example and without limitation, the layers are removed by known lithographic procedures and by etching at the sites that subsequently correspond to the spaces separating the elementary light sources 420 from one another on the substrate. A plurality of several tens or hundreds or thousands of pixels 420 having a surface area smaller than one square millimetre for each individual pixel, and having a total surface area greater than 2 square millimetres, having semiconductor layers with homogeneous thicknesses, and therefore having homogeneous and high internal series resistances, are able to be produced on the substrate 428 of a light source 400. Generally speaking, the more the size of each LED pixel decreases, the more its series resistance increases, and the more this pixel is able to be driven by a voltage source. As an alternative, the substrates comprising the deposited layers covering at least part of the surface of the substrate is sawn or divided into elementary light sources, each of the elementary light sources having similar characteristics in terms of their internal series resistance.

The illustration of FIG. 4 also shows, solely by way of example, a via connection 426 between layers of the elementary source 420. Depending on the type of semiconductor elementary source 420, such connections are necessary in order to ensure that the light source operates. Any vias also have an impact on the internal series resistance of the light source 400.

The embodiment that has just been described is not limiting, and the invention pertains in the same way to types of elementary light sources having semiconductor elements involving other semiconductor layer configurations. In particular the substrates, the semiconductor materials of the layers, the layout of the layers, their thicknesses and any vias between the layers may be different from the example of FIG. 4, as long as the structure of the semiconductor layers is such that the internal series resistance of the elementary light source resulting therefrom is at least 1 ohm, and preferably at least 5 or 10 ohm, or else between 1 and 100 ohm.

The scope of protection is defined by the following claims.

The invention claimed is:

1. A light source configured to be supplied with power by a voltage source, the light source comprising:
   a parallel assembly of at least two branches, each branch comprising a series assembly of a plurality of elementary light sources, each elementary light source being a single light emitting diode (LED),
   wherein each of the elementary light sources has an approximately identical internal series resistance of at least 1 ohm, the internal series resistance of each elementary light source being determined by a structure of semiconductor layers contained in each elementary light source,
   wherein none of the branches of the assembly comprises an electric current regulation device external to the elementary light sources, other than a switch device,
   wherein electric current flowing through each of the branches is distributed uniformly so that the plurality of elementary light sources have a homogenous brightness,
   wherein each elementary light source includes:
      an electrically conductive layer;
      a n-doped semiconductor layer;
      a quantum well layer;
      an electron blocking layer; and
      a p-doped semi-conductor layer, and
   wherein the n-doped semiconductor layer is deposited directly on the electrically conductive layer, the quantum well layer is deposited directly on the n-doped semiconductor layer, the electron blocking layer is deposited directly on the quantum well layer, and the p-doped semi-conductor layer is deposited directly on the quantum well layer.

2. The light source according to claim 1, wherein at least some of the branches of the assembly comprise the switch device connected in series with the elementary light sources on the low side of the branch.

3. The light source according to claim 2, wherein the switch device comprises an N-channel metal-oxide-semiconductor field-effect transistor (MOSFET).

4. The light source according to claim 1, wherein the internal series resistance of the elementary light sources is determined by the thickness of the semiconductor layers, their extent, via connections between the layers, or by a combination of these factors.

5. The light source according to claim 1, wherein the internal series resistances of each of the elementary light sources are approximately identical and between 1 and 100 ohm.

6. The light source according to claim 1, wherein the elementary light sources form part of a monolithic component in which the semiconductor layers of the elementary light sources are arranged on a common substrate.

7. The light source according to claim 1, wherein each of the elementary light sources comprises an n-doped semiconductor layer with a thickness of between 0.1 and 1 μm.

8. The light source according to claim 1, wherein the elementary light sources are arranged on a common substrate so as to form a matrix of elementary light sources.

9. A lighting module for a motor vehicle, comprising the voltage source operationally connected to the light source, according to claim 1, wherein the electric voltage level supplied by the voltage source to the light source is suitable for supplying power thereto.

10. The lighting module according to claim 9, comprising the light source, wherein the lighting module comprises a control unit operationally connected to switches of each branch of the assembly of the light source and intended to command the opening state of said switches.

11. A method for manufacturing elementary light sources of a light source according to claim 1, wherein the p-doped and n-doped semiconductor layers of all of the elementary light sources are produced uniformly on a common substrate, such that an electric current with a uniform intensity flows to the elementary light sources when a common electric voltage is applied to the light source.

12. The method of manufacturing according to claim 11, wherein the p-doped and n-doped semiconductor layers are deposited using a metal oxide chemical vapour deposition (MOCVD) method.

13. The light source according to claim 2, wherein the internal series resistance of the elementary light sources is determined by the thickness of the semiconductor layers, their extent, via connections between the layers, or by a combination of these factors.

14. The light source according to claim 2, wherein the internal series resistances of each of the elementary light sources are identical and between 1 and 100 ohm.

15. The light source according to claim 2, wherein the elementary light sources form part of a monolithic component in which the semiconductor layers of the elementary light sources are arranged on a common substrate.

16. The light source according to claim 2, wherein each of the elementary light sources comprises an n-doped semiconductor layer with a thickness of between 0.1 and 1 μm.

17. The light source according to claim 2, wherein the elementary light sources are arranged on a common substrate so as to form a matrix of elementary light sources.

18. The light source according to claim 1, wherein each elementary light source is a monolithic structure.

* * * * *